United States Patent [19]
Irikawa et al.

[11] Patent Number: 5,251,224
[45] Date of Patent: Oct. 5, 1993

[54] QUANTUM BARRIER SEMICONDUCTOR OPTICAL DEVICE

[75] Inventors: Michinori Irikawa, Yokohama; Masayuki Iwase, Tokyo, both of Japan

[73] Assignee: The Furukawa Electric Co., Ltd., Tokyo, Japan

[21] Appl. No.: 789,201

[22] Filed: Nov. 8, 1991

[30] Foreign Application Priority Data

Nov. 9, 1990 [JP] Japan .................. 2-305785

[51] Int. Cl.$^5$ .............................................. H01S 3/19
[52] U.S. Cl. .................................................... 372/45
[58] Field of Search ................................. 372/45, 44

[56] References Cited

U.S. PATENT DOCUMENTS

5,132,981 7/1992 Uomi et al. ........................ 372/45
5,181,086 1/1993 Yoshida ............................. 372/45

OTHER PUBLICATIONS

Agrawal, G. P. et al., Chpt. 3, "Recombination Mechanisms in Semiconductors", *Longwavelength Semiconductor Lasers*, Oct. 1986, Van Nostrand Reinhold Co., pp. 70-138.

Yano, M. et al, "Temperature Characteristics of Double-Carrier-Confinement (DCC) Heterojunction InGaAsP($\lambda=1.3$ μm)/InP Lasers", *IEEE J. Quantum Electronics*, vol. QE-19, No. 8, Aug. 1983, pp. 1319-1327.

Japanese Laid-Open Patent Official Gazette No. 46788/1988 (Iga, Koyama and Uenohara, Tokyo Institute of Technology) Feb. 1988.

Iga, K. et al., "Electron Reflectance of Multiquantum Barrier (MQB)", *Electronics Letter*, vol. 22, No. 19, 11 Sep. 1986, pp. 1008-1009.

"Achievements of 660 nm GaInP/AlInP Visible Light Lasers by a Novel Multi-Quantum Barrier (MQB) Effect", IEEE, Laser Conference, PD-10, 1990. (no month).

Hasenberg, T. C. et al, "Low Threshold, high $T_o$ InGaAsP/InP 1.3 μm lasers grown on p-type InP substrates", *Appl. Phys. Lett.* 49(7), 18 Aug. 1986, pp. 400-402.

Uenohara, et al, "Analysis of Electron Wave Reflectivity and Leakage Current of Multi Quantum Barrier: MQB", *The Transactions of the Institute of Electronics Information and Communication Engineers*, vol. J70-C No. 6, pp. 851-857, Jun., 1987.

Schiff, L. I., "Continuous Eigenvalues: Collision Theory", *Quantum Mechanics*, pp. 100-105, Feb. 1968, 3rd ed. Publisher: McGraw.

Schuermeyer, F. L. et al, "Band-edge Alignment In Heterostructures", *Appl. Phys. Lett.* 55(18), 30 Oct. 1989, pp. 1877-1878.

*Primary Examiner*—James W. Davie
*Attorney, Agent, or Firm*—Jacobson, Price, Holman & Stern

[57] ABSTRACT

The quantum barrier semiconductor optical devices according to this invention are characterized by strained layer super lattice multiple quantum barriers provided between active layer and p-clad layer or within p-clad layer to obtain resonance scattering of incident overflowing electrons, that is to realize phase condition in which the incident overflowing electron wave and reflected electron wave enhance each other, in the double heterostructure where active layer having at least one GaInAs(P) layer is sandwiched between n-clad layer and p-clad layer. In this case, the active layer should desirably have quantum well structure. The quantum barrier semiconductor optical device comprises a DCCtype double heterostructure made by growing an n-clad layer, a fist active layer having at least one GaInAs(P) sub-layer, a middle clad layer, a second active layer having at least one GaThAS(p) sub-layer, and a p-clad layer in the order of mention or vice versa and a super lattice resonance scattering type quantum barriers provided between the first active layer and middle clad layer or in the middle clad layer and/or between the second active layer and p-clad layer or within p-clad layer. In this case also, the active layer should desirably have quantum well structure and the quantum barriers should desirably be made up of strained layer super lattice.

5 Claims, 7 Drawing Sheets

(a)

(b)

QUANTUM BARRIER SEMICONDUCTOR OPTICAL DEVICE

BACKGROUND OF THE INVENTION

This invention relates to a low operating current longwavelength region quantum barrier semiconductor optical device superior in temperature characteristic.

Well known semiconductor laser diodes (LD) for long wavelength region optical communications are double heterostructure LDs with a GaInAs(P) active layer and an InP clad layer, which are put in practical use as light sources for trunk optical communication lines.

Longwavelength region laser devices are fitted with a Peltier device when applied to trunk line systems since they are inferior to shortwave length region ones in temperature stability.

Lasing threshold current $I_{TH}$ of laser diodes is expressed as function of temperature T by equation:

$$I_{TH.} = I_{THO} \times \exp(T/T_o) \quad (1)$$

wherein T, $T_o$ represent operating temperature and characteristic temperature in Kelvin respectively. As is seen in eq(1), high $T_o$ values mean superior stability of threshold current in wide temperature range. For example, shortwavelength region laser diodes exhibit characteristic temperature $T_o > 150K$. In the case of longwavelength region laser diodes, on the other hand, their characteristic temperature $T_o$ marks 130°–140° K below the temperatures less than approximately 10° C. but lowers to 60°–80° K above the temperatures approximately 10° C.

The following three mechanisms have been considered as causes of low characteristic temperature of longwavelength region laser diodes.

1-1 Thermal excitation and diffusion leakage of electrons from the active layer to the clad layer.

1-2 Leakage of hot electrons excited in the conduction band by Auger CHCC process and over flow to the clad layer.

1-3 Increase of light absorption due to the excitation of holes in valence band by Auger CHHS process.

Of the above, mechanism 1-2 is said to be a main cause of lowering the characteristic temperature in longwavelength region laser diodes.

The reasons for regarding 1-2 as main cause of lowering characteristic temperature $T_o$, (K) are as described in the article by: G. P. Agrawal et al.: Longwavelength Semiconductor Lasers, Van Nostrand Reinhold Company, pp. 70–138. This article describes that the leakage current increment via mechanism (1-1) is as small as less than 100 A/cm$^2$ in the 1.3 µm region and that light absorption increase via mechanism (1-3) does not sufficiently elucidate actual dependence of current on temperature.

How to decrease the electron overflow caused by the Auger effect is therefore of key factor in improving temperature characteristics of longwavelength region laser diodes.

From this standpoint, use of DCC (double carrier confinement) and MQB (multi-quantum barrier) methods have been studied to improve temperature characteristic of longwavelength region laser diodes.

The article by M. Yano et al. published in the IEEE J. Quantum Electron. Vol. QE-19, pp. 1319–1327, describes DCC type laser diodes as shown in FIGS. 4(a) to (c) with cross sectional structure, energy band diagram and temperature characteristics of threshold current.

The DCC structure in FIG. 4(a) is fabricated by growing and forming n-Inp clad layer 2, a first GaInAsP active layer 3, a p-InP middle clad layer 4, a second p-GaInAsP active layer 5, a p-InP clad layer 6, a p-GaInAsP contact layer 7, an n-InP block layer and a p-electrode 9 on an n-InP substrate 1.

The laser diodes with such a DCC structure as shown in FIG. 4(a) show improved characteristic temperature of 130° to 210° K up to about 80° C. as is shown in FIG. 4(c) and also exhibit reduced temperature dependency on the differential quantum efficiency.

The reason for improved temperature characteristics of DCC structure LD is that the hot electrons overflowing from the first active layer generating the main part of the gain required for lasing are scattered by the middle clad layer to lose energy and captured by the second active layer to contribute again to stimulated emission. Therefore, the DCC structure in FIG. 4(a) produces the effect equivalent to the reduction of the effects caused by mechanism 1-2.

In MQB type devices, super lattice structures are formed so as to reflect electrons as waves in such phase that the reflected and incident waves enhance each other i.e. to realize the maximum value of the reflection coefficient of incident electron waves.

Such MQB type devices are dealt with in the Japanese Laid-Open Patent Official Gazette No. 46788/1988 (Iga, Koyama and Uenohara, Tokyo Institute of Technology) and the article by Iga, Uenohara and Koyama, Electronics Letters Vol. 22 pp. 1008–10091, 1986.

The laser diode mentioned in the Japanese patent publication describes an MQB electron reflecting layer 10 between GaInAsP active layer 3 and a P-INP clad layer 6 as schematically shown in FIG. 5.

Specifically, effective barrier height of the laser diode in FIG. 5 is made higher than a classical one by providing a plurality of periodic structures with different barrier thicknesses and well thicknesses between its GaInAsP active layer 3 and a P-INP clad layer 6.

Recently, MQB type visible red laser diodes have been described by K. Kishino et al., IEEE, Laser Conference, PD-10, 1990 The literature states that characteristic temperature is increased and threshold current density is reduced when an GaInP/AlInP MQB structure is introduced. T. C. Hasenberg et al., Applied Physics Letter, Vol. 49 No. 7, p. 400, 1986, states the following problems to be solved for DCC structures.

2-1 Their threshold current densities are about twice as large as those of conventional semiconductor laser diodes.

2-2 When the thicknesses of active and middle clad layers are decreased, not only is the threshold current density decreased but also characteristic temperature approach the values of conventional semiconductor laser diodes.

Problem 2-2 is attributed to the mechanism in which energy relaxation activity at the middle clad layer decreases so as electrons become difficult to be captured by the second active layer.

Conventional MQB devices proposed so far pose such problems as described below.

Theoretical study as to the increase of effective barrier height in MQB structure in materials for longwavelength region optical devices is discussed by Uenohara, et al., The Transactions of the Institute of Electronics, Information and Communication Engineers Vol. J70-C No. 6 pp. 851-857, 1987. This article states that effective barrier height of $Ga_{0.47}In_{0.53}As$/InP MQB laser devices can be increased by 0.16 eV in height. Therefore, resulting effective total barrier height is estimated to be 0.5 eV by adding conventional hetero barrier height 0.35 eV.

But the main cause of low characteristic temperature in longwavelength region laser diodes is considered to be overflow of the hot electrons generated by the Auger CHCC process. And the maximum energy level of those hot electrons is about 1 eV higher than the conduction band edge, therefore 0.5 eV higher than the above mentioned effective barrier height 0.5 eV, for 1.3 μm LDs. However, no report has been published on any MQB laser devices effective for such hot electrons, so far.

In view of what is described heretofore, principles of MQB structures will be briefly discussed with the simplified model of one dimensional collision problem of an electron wave with one well potential or one barrier potential made by L. I. Schiff, Quantum Mechanics, P. 100, Continuous Eigenvalues: Collision theory, McGraw-Hill.

In FIG. 6(a), symbol $V_o$ denotes the well depth, $E_o$, energy of a incidence carrier, (m) effective mass of the carrier in the well and (a), thickness of the well.

In this case, reflection coefficient R is given by following equation.

$$R = 1/\{1 + [4E_o(E_o + V_o)]/[V_o \sin^2(k_2 a)]\} \quad (2)$$

where $k_2$ is given by:

$$k_2 = \{[2m(E_o + V_o)]/(h/2\pi)^2\}^{\frac{1}{2}} \quad (3)$$

The phase condition for giving the maximum value $R_{max}$ of reflection coefficient is given by following equation.

$$k_2 a = [n + (\tfrac{1}{2})]\pi \quad (4)$$

where, n = 0, 1, 2 ... At this condition, $R_{max}$ is given by equation:

$$R_{max} = 1/\{1 + [4E_0(E_o + V_o)]/(V_o^2)\} \quad (5),$$

representing collision of an electron wave with one dimensional barrier potential.

In FIG. 6(b), symbol $V_o$ denotes barrier height, $E_o$ energy of a incident carrier, (m), effective mass of the carrier in the barrier and (a), thickness of the barrier. When $E_o \geq V_o$, the reflection coefficient R mentioned above is expressed by equation:

$$R = 1/\{1 + [4E_o(E_o - V_o)][/]V_o \sin^2(k_2 a)]\} \quad (6)$$

where, $$k_2 = \{[2m(E_o - V_o)]/(h/2\pi)^2\}^{\frac{1}{2}} \quad (7)$$

The phase condition for giving the maximum value $R_{max}$ of reflection coefficient is given by equation:

$$k_2 a = [n + (\tfrac{1}{2})]\pi \quad (8)$$

where, n = 0, 1, 2. At this condition, $R_{max}$ is given by equation:

$$R_{max} = 1/\{1 + [4E_0(E_o - V_o)]/(V_o^2)\} \quad (9)$$

When $V_o > E_o > 0$, the reflection coefficient R mentioned above is expressed by equation:

$$R = 1/(\{1 + [4E_o(V_o - E_o)]/[V_o^2 \sinh^2(k_1 a)]\} \quad (10)$$

and $(k_1)$ therein is given by equation:

$$k_1 = \{[2m(V_o - E_o)]/(h/2\pi)^2\}^{\frac{1}{2}} \quad (11)$$

In this case, therefore, there is no resonance condition, so the reflection coefficient R comes close to "1" with the increase of value $(k_2 a)$ when width (a) of the barrier is increased.

The MQB laser diodes which require coherency of electron wave are subject to the limitation of increasing thickness of barrier because coherent length is limited by the order of the mean free path of the carrier.

The energy level of hot electron with maximum energy corresponds to equations (5) or (9) in case of well or barrier potential respectively. Therefore, $R_{max}$ values were calculated as functions of normalized incident energy $(E_o/V_o)$ for equations (5) and (9), obtaining the results as shown in FIGS. 7(a) and 7(b).

As is apparent from FIGS. 7(a) and 7(b), the maximum value $R_{max}$ of the reflection coefficient R decreases when value $(E_o/V_o)$ increases.

FIG. 8 shows the potential configuration of a barrier made of InP and $Al_xIn_{1-x}As$ (x=0.48) said to have the smallest electron affinity among materials lattice matched to InP. In the case of such barrier potential as shown in FIG. 8, an AlInAs layer 11 lattice matched to InP is provided between p-InP clad layer 6 and GaInAsP active layer 3.

When this barrier potential is applied to a 1.3 μm LD, hot electron with maximum 950 meV gives $E_o/V_o = 2.93$. The corresponding $R_{max}$ is 0.04 as is clear in FIG. 7(b).

That is, this barrier potential reflects only 4% of hot electrons with maximum energy even under the phase condition of maximum reflection.

When a multi-layer barrier structure is used to obtain reflection factor R=1, more than 10 barrier layers are necessary for a specific incident energy. A MQB layer which is more than several times as thick as the above multi-layer barrier is necessary for its application to a wide range of incident energy.

This is not desirable for aforementioned coherent length because it lowers coherency and decreases its effect as an MQB.

As is stated heretofore, the potentials made from materials lattice matched to InP are not suitable for MQB layers, having no adequate function of reflecting the hot electrons generated due to Auger CHCC process.

SUMMARY OF THE INVENTION

In order to solve such problems as described heretofore the present invention is intended to provide a quantum barrier semiconductor optical device with efficient reflection of the hot electrons generated due to the Auger process and with superior temperature characteristics and current characteristics (low threshold value).

Accordingly, the quantum barrier semiconductor optical devices according to the present invention features strained layer super lattice multiple quantum barriers provided between the active layer and the p-clad layer or within the p-clad layer to obtain resonance scattering of incident overflowing electrons, to realize the phase condition in which the incident overflowing electron wave and reflected electron wave enhance each other, in the double heterostructure where active layer having at least one GaInAs(P) layer is sandwiched between the n-clad layer and the p-clad layer.

According to another embodiment, the quantum barrier semiconductor optical device comprises a DCC type double hetero-structure-made by growing an n-clad layer, a first active layer having at least one GaInAs(P) layer, a middle clad layer, a second active layer having at least on GaInAs(P) layer, and a p-clad layer, and super-lattice resonance scattering type quantum barriers being provided between the first active layer and middle clad layer or in the middle clad layer and/or between the second active layer and p-clad layer or within p-clad layer.

The quantum barrier semiconductor optical devices according to this invention utilize the increase of conduction band edge discontinuity, i.e. the increase of barrier height introduced by the strained layer super-lattice, particularly by the super-lattice barrier having an in-plane tensile strain, in the quantum barrier structure provided between the p-clad layer and the active layer.

If the aforementioned quantum barrier structure is MQB type, band discontinuity increases further and formation of a thicker strained super lattice becomes possible when the barriers are given an in-plane tensile strain and the wells are given an in-plane compressive strain.

The control of band discontinuity by using a strained layer super lattice has already proposed by F. Schuemeyer et al.: Applied Physics Letter 55, pp. 1877–1878, 1989. This article states that conduction band edge discontinuity increases by 0.27 eV when Al$_x$In$_{1-x}$As is given a tensile strain of about 1% in Al$_x$In$_{1-x}$As/InP structure.

In case a 1% tensile strained barrier is made of Al$_x$In$_{1-x}$As (x=0.62) and InP accordingly, the barrier height against InP clad is given a height of 510 meV in connection with an embodiment of the invention.

Figure 7:
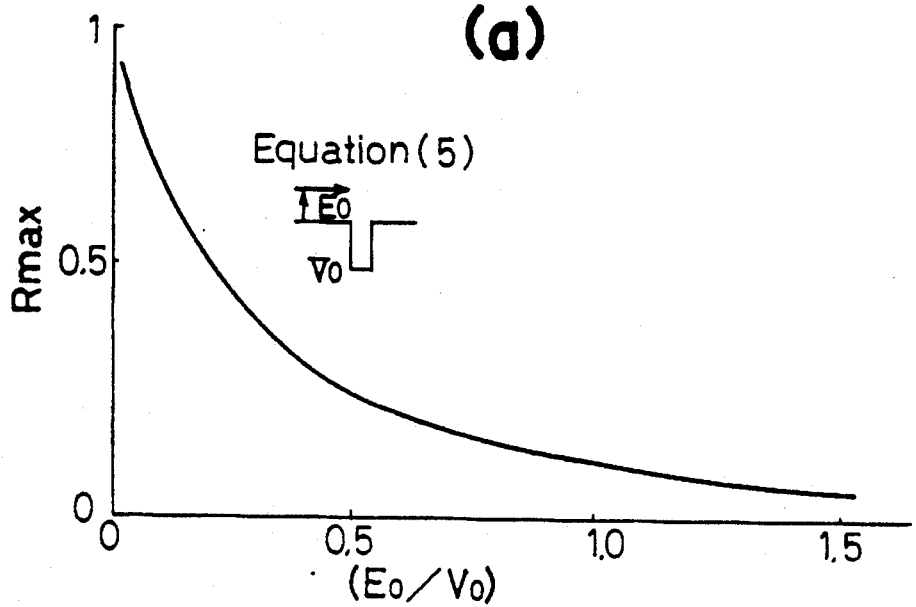
FIG. 7(a) shows the calculated results for the dependence of maximum reflection coefficient on the ratio ($E_o/V_o$) of the incidence energy and the depth of the well for the square well potential in FIG. 6(a).
FIG. 7(b) shows the calculated results for the dependence of maximum reflection coefficient on the ratio ($E_o/V_o$) of the incidence energy and the height of the barrier for the square barrier potential in FIG. 6(b).
Figure 7:
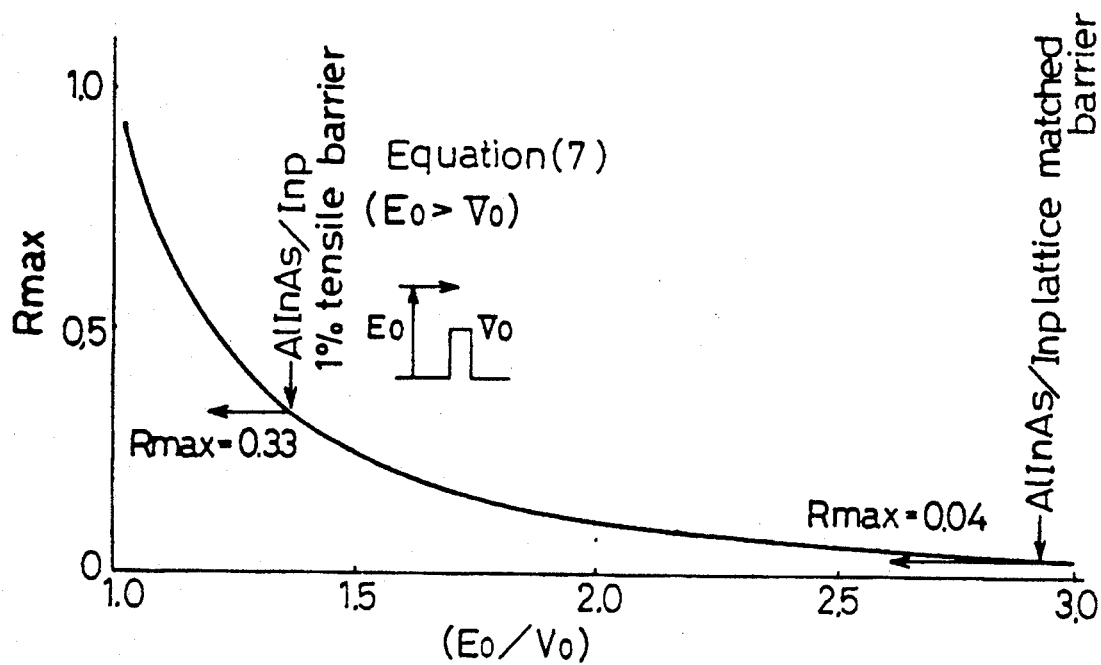
Figure 8:
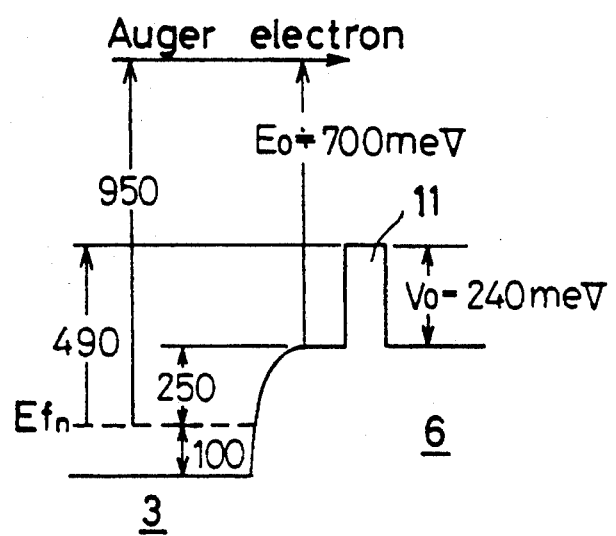
FIG. 8 shows the energy band diagram of a lattice matched barrier between active layer and p-clad layer in 1.3 μm LD, the energy level of Auger electrons with maximum incident energy, and a barrier which consists of lattice matched AlInAs and InP.

Consequently, for hot electrons with a maximum energy of 950 meV that is generated in 1.3 μm laser diode, values $E_o/V_o=1.37$ and $R_{max}$ 0.33 can be obtained as shown in FIG. 7(b). Above $R_{max}$ value, is as much as eight times as large as that of unstrained quantum barrier and enough for practical use.

An MQB structure with effective reflecting function against hot electrons generated by the Auger effect can be obtained by combining a plurality of such strained super lattice barriers so that this MQB can prevent hot electrons from overflowing to the clad layer.

In the quantum barrier semiconductor optical device according to the second embodiment, the MQB structure is applied to the DCC structure. Even if the middle clad layer is decreased in thickness, the feature of DCC structure is not lost by MQB structure. Therefore, superior temperature characteristic and low threshold current density are realized.

The quantum barrier semiconductor optical device according to the second embodiment can be expected to produce more effective electron confinement effect, provided its MQB structure is formed by strained super lattice.

The above objects and advantages of the present invention will become more readily apparent when reference is made to the following description taken in conjunction with the accompanying drawings.

DETAILED DESCRIPTION OF THE PREFERRED EMBODIMENT

Figure 1:
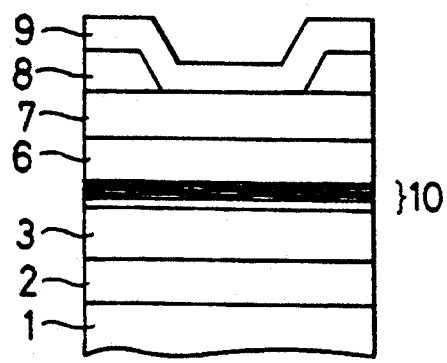
FIG. 1(a) is a cross sectional view of a longwavelength region laser diode according to the present invention
FIG. 1(b) shows the energy band diagram at zero-bias condition of the laser diode of FIG. 1(a).
Figure 1:
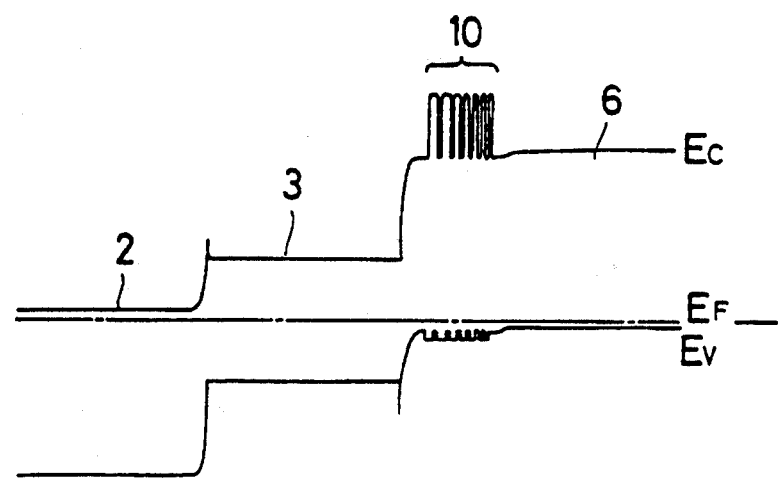

FIG. 1(a) shows the laser diode as one of the embodiments of the present invention. FIG. 1(b) shows the zero-bias energy band diagram of the laser diode.

The laser diode shown in FIGS. 1(a) and 1(b) is made by depositing an n-InP clad layer 2, a GaInAsP active layer 3, a strained super lattice MQB layer 10 made of n-InP and 1% tensile strained Al$_x$In$_{1-x}$As (x=0.62), a p-InP clad layer 6, a p-GaInAsP contact layer 7, an n-InP block layer 8 and p-electrode 9 in the specified order on an n-InP substrate. Strained MQB layer 10 is p-doped up to about $10^{16}$–$10^{17}$ cm$^{-3}$.

Figure 2:
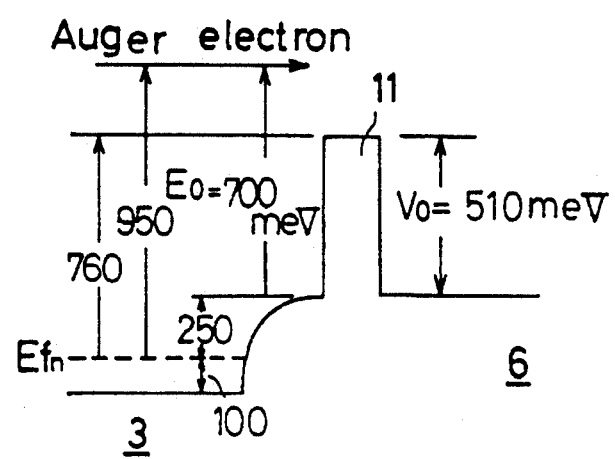
FIG. 2 shows the energy band diagram of a strained super lattice barrier between active layer and p-clad layer in 1.3 μm LD, the energy level of Auger electrons with maximum incident energy, and a barrier which consists of an AlInAs layer with 1% of in-plane tensile strain and InP layer.

FIG. 2 shows a potential configuration of a barrier comprising InP and Al$_x$In$_{1-x}$As (x=0.62) involving in-plane tensile strain of 1%. In this example, barrier layer is provided between the p-InP clad layer 6 and GaInAsP active layer 3.

The potential configuration in FIG. 2 has barrier height of 510 meV against p-InP clad.

Therefore, when this strained barrier potential is applied to 1.3 μm laser diodes, a practical-value of maximum coefficient $R_{max}$ can be obtained, because $E_o/V_o=1.37$ for the hot electrons incident with a maximum energy of 950 meV and corresponding $R_{max}$ value is 0.33 as is shown in FIG. 7(b).

Such a strained super-lattice barriers can have maximum reflection coefficient of about 30% per barrier layer. It can therefore be given a reflection coefficient of 100% by integrating a plurality of such strained barrier layers.

Figure 3:
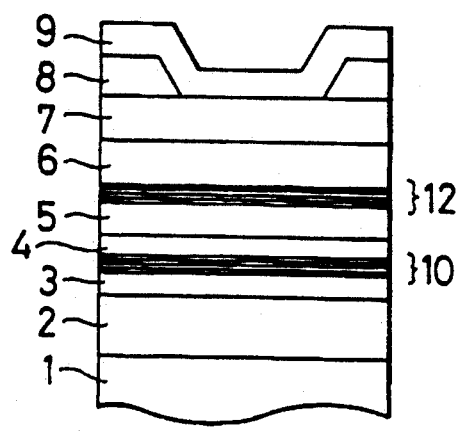
FIG. 3(a) is a cross sectional view of an DCC laser diode according to a second embodiment of the present invention.
FIG. 3(b) shows the energy band diagram at zero-bias condition of the laser diode of FIG. 3(a).
Figure 3:
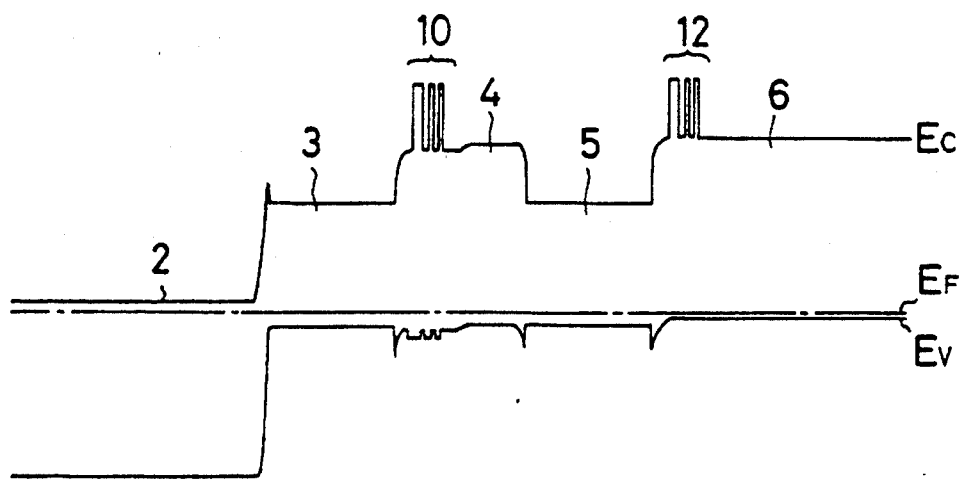
Figure 4:
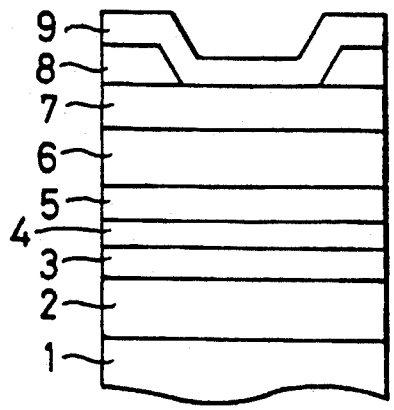
FIG. 4(a) is a cross sectional view of a conventional DCC laser diode.
FIG. 4(b) shows the energy band diagram for the diode of FIG. 4(a).
FIG. 4(c) shows the temperature characteristics of the diode of FIG. 4.
Figure 4:
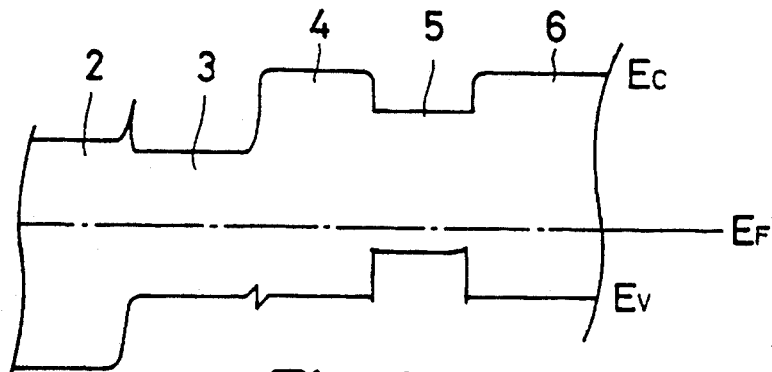
Figure 4:
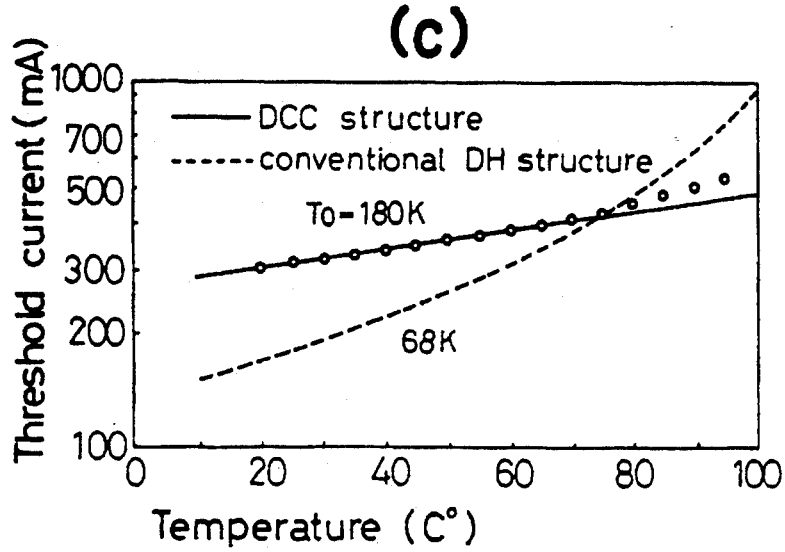
Figure 5:
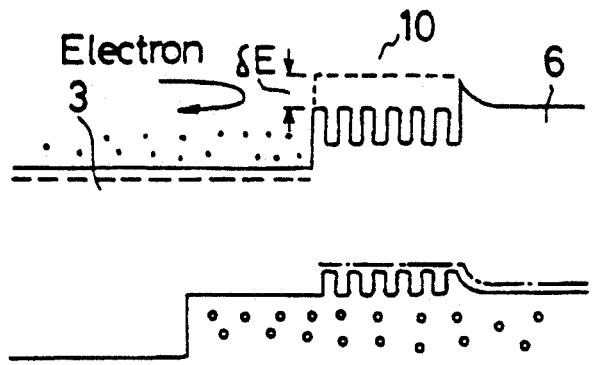
FIG. 5 illustrates the increase of effective hetero-barriers in MQB structure.
Figure 6:
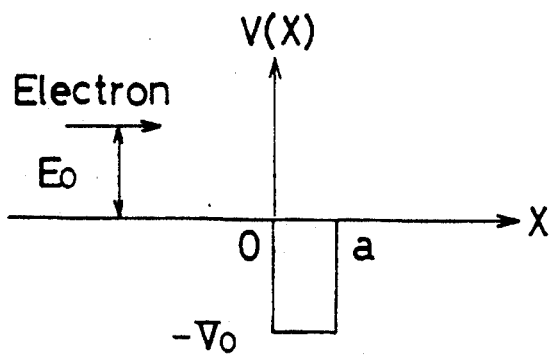
FIG. 6(a) shows a one-dimensional square well potential and FIG. 6(b) shows a one-dimensional square barrier potential.
Figure 6:
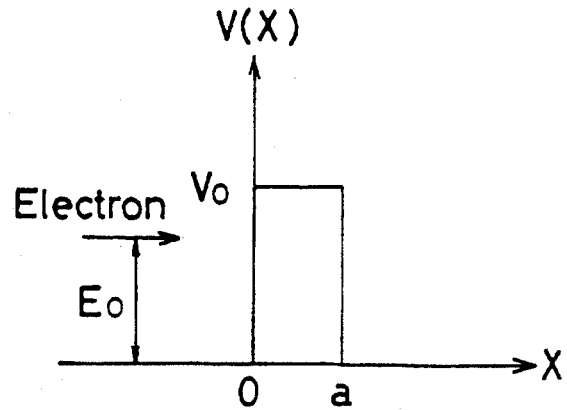

FIG. 3(a) shows the DCC laser diode according to the second embodiment of the present invention. FIG. 3(b) shows its energy band diagram.

The laser diode in FIGS. 3(a) and 3(b) is fabricated by depositing 600 Å-thick first GaInAsP active layer 3, a strained super-lattice MQB layer 10, a 400 Å-thick p-InP middle clad layer 4, a 600 Å-thick second GaInAsP active layer 5, a strained super-lattice MQB layer 12, a p-InP clad layer 6, a P-GaInAsP contact layer 7, an n-InP block layer 8 and p-electrode 9 in the specified order on the n-InP clad layer on an n-InP substrate. Both active layers 3, 5 have same band gap wavelength value of 1.3 μm.

As described above, in conventional DCC structures, characteristic temperature degrades and approaches the value of conventional laser diode when thickness of the middle clad layer is reduced from 1,000 Å.

In the case of the DCC laser diode in FIGS. 3(a) and 3(b), on the other hand, the hot electrons generated in the first active layer 3 are reflected by the MQB layer 10 and the electrons travel through to the p-clad layer 6, maintaining a high energy, can be reflected by the MQB layer 12 and captured by the second active layer 5.

The DCC laser devices in FIGS. 3(a) and 3(b), therefore, permit thicknesses of middle clad layer 6 to be reduced to small values and threshold current to be decreased maintaining superior temperature characteristic.

Concerning material for the tensile strained super lattice layers, GaIn(As)P barrier layer with a tensile strain of about +5% can be also adopted as well as AlInAs barrier with 1% tensile strain. And as to active layer structure, quantum well (QW) structure accompanied by suitable SCH (Separated Confinement Heterostructure) layer can be used and realize lower threshold current density. Regarding current blocking structure, BH (Burried Heterostructure) of BC (Burried Crescent) structures can be used instead of the structure in FIGS. 1 and 3.

In above embodiment, only semiconductor laser diodes were described, but similar effect or improvement can be expected for semiconductor laser amplifiers.

As is apparent from the foregoing description, the quantum barrier semiconductor optical devices according to the invention permit realization of an MQB layer with an effective reflecting function for the hot electrons generated due to Auger process. As a result, overflow leakage current due to Auger process can be effectively suppressed, and temperature characteristics can be drastically improved in optical devices like LDs in longwavelength region.

Another advantage is that a low threshold current DCC laser diode is obtainable.

We claim:

1. A semiconductor optical device comprising a substrate, a buffer layer formed on said substrate, a double heterostructure including a pair of p-type and n-type cladding layers and an active layer consisting of $Ga_xIn_{1-x}As_yP_{1-y}(0<x\leq0.47, 0<y\leq1.0)$ or $(Ga_{0.47}In_{0.53}As)_{1-z}(Al_{0.48}In_{0.52}As)_z(0<Z\leq1)$ lattice matched to InP and sandwiched between said cladding layers and a pair of ohmic metals, a part of said p-cladding layer consisting of a strained-layer multi-quantum barrier structure having a strained-layer super-lattice structure which reflects an electron wave incident upon said p-type cladding layer from said active layer in such a phase condition so that said incident electron wave and reflected wave of said incident electron wave enhance each other, said multi-quantum barrier structure having an effective barrier height against said incident electrons higher than actual barrier height.

2. A semiconductor optical device claimed in claim 1, wherein said active layers comprise quantum well structure including strained quantum well structure.

3. A semiconductor optical device comprising a substrate, a buffer layer formed on said substrate, a double carrier confinement type double-heterostructure including a pair of p-type and n-type cladding layers, a first active layer, a middle cladding layer and a second active layer formed in said order from n-cladding side to p-cladding side between said n-type and p-type of cladding layers and wherein said first and second active layers consisting of $Ga_xIn_{1-x}As_yP_{1-y}(0<x\leq0.47, 0<y\leq1.0)$ or $(Ga_{0.47}In_{0.53}As)_{1-z}(Al_{0.48}In_{0.52}As)_z(0<Z\leq1)$ lattice matched to InP, and a pair of ohmic metals, a part of said p-cladding layer or of said middle cladding layer consisting of a multi-quantum barrier structure having a supper lattice structure which reflects an electron wave incident upon said p-type cladding layer from said two active layers or incident upon said middle cladding layer from said first active layer in such a phase condition so that said incident electron wave and reflected wave of said incident electron wave enhance each other, said multi-quantum barrier structure having an effective barrier height against said incident electrons higher than actual barrier height.

4. A semiconductor optical device claimed in claim 3, wherein said multi-quantum barrier structure comprises a strained-layer super lattice structure.

5. A semiconductor optical device claimed in claim 3, wherein one or both of said active layers comprises quantum well structure including strained quantum well structure.

* * * * *

UNITED STATES PATENT AND TRADEMARK OFFICE
CERTIFICATE OF CORRECTION

PATENT NO. : 5,251,224
DATED : October 5, 1993
INVENTOR(S) : IRIKAWA et al

It is certified that error appears in the above-identified patent and that said Letters Patent is hereby corrected as shown below:

On the cover page, in the Abstract, line 17, change "GaThAS(p)" to --GaInAs(P)--.

Signed and Sealed this

Third Day of May, 1994

Attest:

BRUCE LEHMAN

Attesting Officer      Commissioner of Patents and Trademarks